(12) United States Patent
Nakazawa et al.

(10) Patent No.: US 7,355,547 B2
(45) Date of Patent: *Apr. 8, 2008

(54) VEHICLE-MOUNTED MILLIMETER WAVE RADAR DEVICE, MILLIMETER WAVE RADAR MODULE, AND MANUFACTURING METHOD THEREOF

(75) Inventors: Terumi Nakazawa, Naka (JP); Yoshiyuki Sasada, Hitachinaka (JP); Shiro Ouchi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/482,056

(22) Filed: Jul. 7, 2006

(65) Prior Publication Data

US 2006/0250298 A1  Nov. 9, 2006

Related U.S. Application Data

(63) Continuation of application No. 10/681,246, filed on Oct. 9, 2003, now Pat. No. 7,098,842.

(30) Foreign Application Priority Data

Oct. 10, 2002  (JP) .............................. 2002-296872

(51) Int. Cl.
   *G01S 13/00*  (2006.01)
   *H01L 23/28*  (2006.01)
(52) U.S. Cl. .................. 342/70; 342/175; 174/521
(58) Field of Classification Search .......... 342/32–104, 342/175, 195; 257/275; 174/521
   See application file for complete search history.

(56) References Cited

U.S. PATENT DOCUMENTS 5,657,024 A   8/1997  Shingyoji et al.
5,943,558 A   8/1999  Kim et al.
5,955,752 A   9/1999  Fukaya et al.
6,130,640 A   10/2000 Uematsu et al.
6,249,242 B1  6/2001  Sekine et al.
6,504,096 B2* 1/2003  Okubora ..................... 174/521
6,600,103 B1  7/2003  Schmidt et al.
7,192,801 B2* 3/2007  Oya ............................ 438/55

FOREIGN PATENT DOCUMENTS

EP      0978729 A2       9/2000
JP      07-273237        10/1995
WO      WO 0045462 A1    8/2000
WO      WO 03040754 A1   5/2003

* cited by examiner

*Primary Examiner*—Thomas H. Tarcza
*Assistant Examiner*—Isam Alsomiri
(74) *Attorney, Agent, or Firm*—Crowell & Moring LLP

(57) ABSTRACT

An object of the present invention is to provide a millimeter wave radar device and module that provides a hollow structure while assuring adequate moisture resistance.

A multilayer substrate on which at least one millimeter wave MMIC is mounted and a cap for forming a hollow around the MMIC are joined together with an adhesive or other similar organic member to obtain a high-frequency characteristic. The resulting assembly is housed in a case and covered with a moisture resistance by a gelled organic resin. The nonairtight structure obtained in this manner permits the use of low-cost members and provides increased productivity.

2 Claims, 4 Drawing Sheets

US 7,355,547 B2

VEHICLE-MOUNTED MILLIMETER WAVE RADAR DEVICE, MILLIMETER WAVE RADAR MODULE, AND MANUFACTURING METHOD THEREOF

CROSS-REFERENCE TO RELATED APPLICATIONS

This application is a continuation of U.S. application Ser. No. 10/681,246 filed Oct. 9, 2003 now U.S. Pat. No. 7,098,842 and claims priority of Japanese patent application no. 2002-296872 filed Oct. 10, 2002.

BACKGROUND OF THE INVENTION

The present invention relates to a vehicle-mounted millimeter wave radar device, millimeter wave radar module, and manufacturing method thereof.

Japanese Application Patent Laid-open Publication No. Hei 7-273237A discloses the semiconductor device which a hollow is provided around an IC chip and sealed up with a structure composed of a first cap, a molded resin, and a second cap. The molded resin is cured by baking after it is covered with the second cap. Since the device has the hollow around the IC chip, it is possible to prevent IC bonding wires from being cut by thermal stress caused by plastic molding. Furthermore, deterioration of the electrical characteristic can be prevented in comparison with the device which IC chip is directly covered by resin, by making a hollow structure around the IC chip.

In a high frequency or other millimeter wave radar RF (Radio Frequency) module, the above conventional technology provides a hollow structure to prevent deterioration in the millimeter wave electrical characteristic. However it fails to assure adequate moisture resistance, and it cannot provide a low-cost millimeter wave radar RF module.

SUMMARY OF THE INVENTION

An object of the present invention is to provide a millimeter wave radar device and module that provides a hollow structure while assuring adequate moisture resistance.

The above object is achieved by a vehicle-mounted millimeter wave radar device that comprises a millimeter wave generation means for generating millimeter waves, an antenna means for sending out the millimeter waves, a substrate that is provided with wiring and the millimeter wave generation means, an enclosure that is joined to the substrate to enclose the millimeter wave generation means and the surrounding space on the substrate in cooperation with the substrate, and a resin that covers the joint between the enclosure and the substrate at least.

A multilayer substrate on which at least one MMIC (Monolithic Microwave Integrated Circuit) for a millimeter wave radar is mounted and a cap for forming a hollow around the MMIC are joined together with an adhesive or other similar organic member to obtain a high-frequency characteristic. The resulting assembly is housed in a case and covered with a moisture resistance by a gelled organic resin. The nonairtight structure obtained in this manner permits the use of low-cost members and provides increased productivity.

Further, the above object is achieved by a method for manufacturing a millimeter wave radar module that sends out radar waves generated by at least one MMIC via an antenna pattern. This method comprises the steps of mounting the MMIC on a wired substrate, enclosing the MMIC by joining a cap containing a hollow to the substrate in such a manner as to position the MMIC in the hollow, and covering the joint with a gel.

DESCRIPTION OF THE PREFERRED EMBODIMENTS

Figure 1:
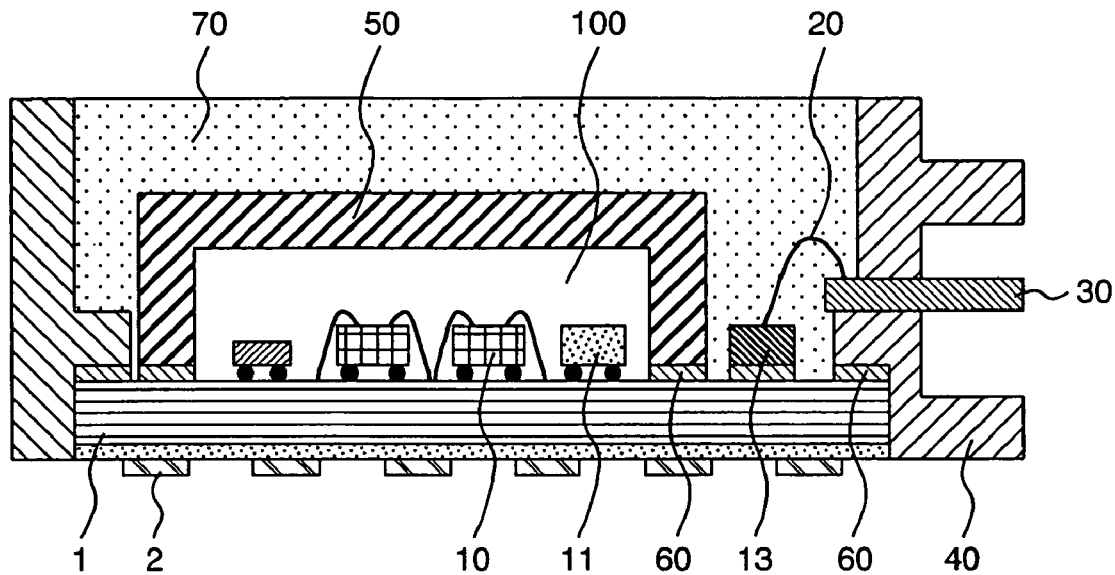
FIG. 1 is a cross-sectional view illustrating the structure of one embodiment of the present invention.

One embodiment of the present invention will now be described with reference to FIG. 1.

A circuit substrate is formed by soldering or wire-bonding MMICs 10, 11 and pads 13 to a multilayer substrate 1, which is formed together with an antenna pattern 2 as one piece. For example, the antenna is comprised of a patch antenna.

A cap 50 is joined to the above circuit substrate with an organic adhesive 60 to make a hollow structure around a circuit section comprised of the MMICs (a millimeter wave generation means) 10, 11.

The hollow structure may be made by performing a juncture process for the cap 50 within nitrogen gas, and be filled with sealing gas 100 of nitrogen gas etc.

Further, the hollow structure may contain a moisture absorbent (not shown) to protect the MMICs from moisture.

A plastic case 40 into which a metal terminal 30 is inserted is joined to a fringe of the multilayer substrate with an organic adhesive 60. In the inside of the plastic case 40, a wire 20 is connected between the pad 13 and the metal terminal 30, and a gel 70 of silicone or the like is filled as a filler except the inside of the cap 50.

The present embodiment, which is configured as described above, has the hollow structure for the MMIC section to provide simple hermetical sealing, retains millimeter waves or other high-frequency electrical characteristic, and effectively uses a gel to provide protection against moisture.

Figure 2:
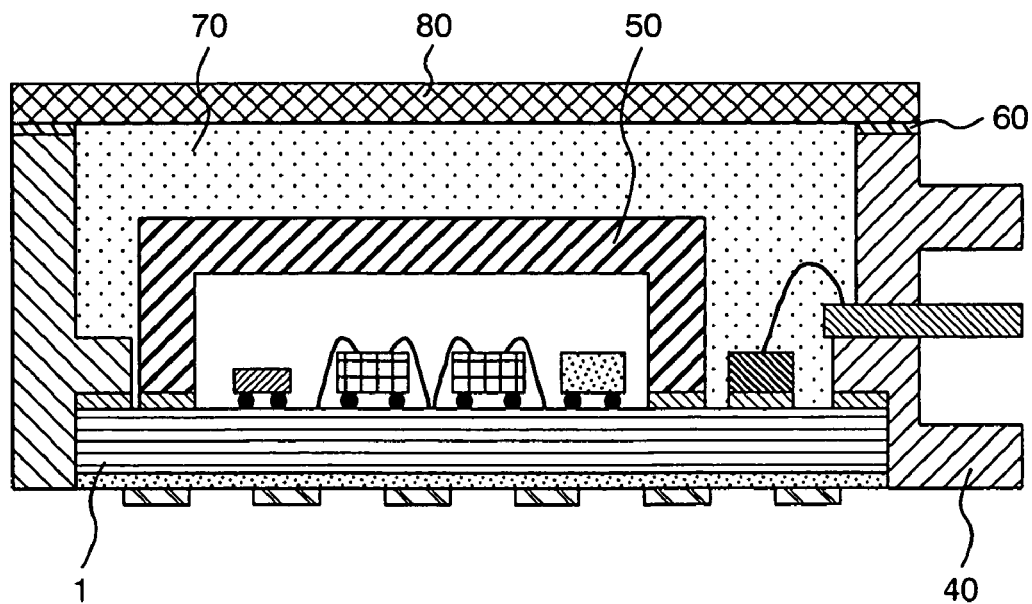
FIG. 2 illustrates another embodiment of the present invention.

FIG. 2 illustrates another embodiment of the present invention. This embodiment differs from the embodiment shown in FIG. 1 in point of joining a plastic cover 80 to the plastic case 40 with an organic adhesive 60. The plastic cover 80 covers an upper opening of the plastic case 40. The present embodiment provides higher moisture resistance than the embodiment shown in FIG. 1.

Figure 3:
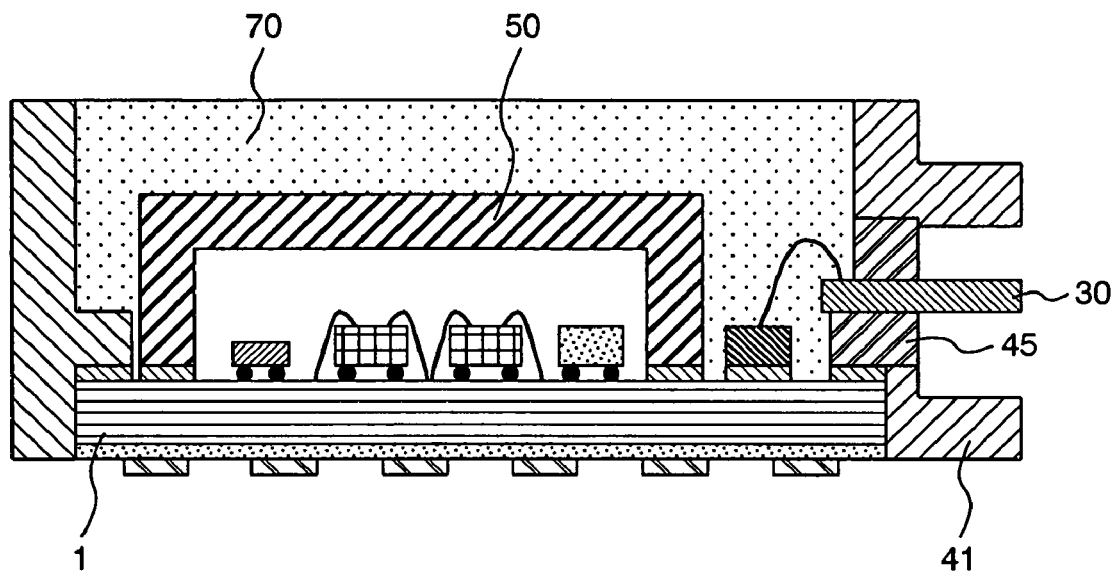
FIG. 3 illustrates another embodiment of the present invention.

FIG. 3 illustrates another embodiment of the present invention. This embodiment differs from the one shown in FIG. 1 in point of using a metal case 41 instead of the plastic case 40 shown in FIG. 1, and using an insulation 45 such as glass to insulate a metal terminal 30 from a metal case 41. The use of this configuration reduces the thermal linear expansion coefficient difference between the multilayer substrate 1 and metal case 41. Consequently, no crack may arise between the multilayer substrate 1 and the metal case 41 due to thermal stress of temperature cycle etc., and increases the moisture resistance.

Figure 4:
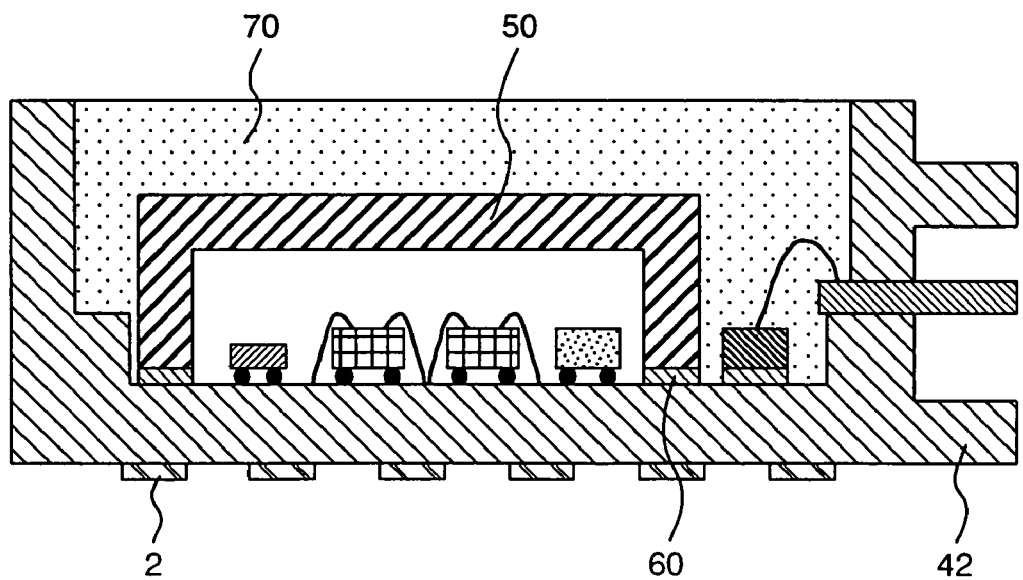
FIG. 4 illustrates another embodiment of the present invention.

FIG. 4 illustrates another embodiment, which differs from the embodiments shown in FIGS. 1 to 3 in that the multilayer substrate 1 and the case (40 or 41) are combined into a single unit 42 instead of being separated from each other.

The use of the above configuration reduces the cost.

It is preferable that the above combined single unit 42 be made of an organic material due to cost considerations. However, it may also be made of an inorganic material.

Figure 5:
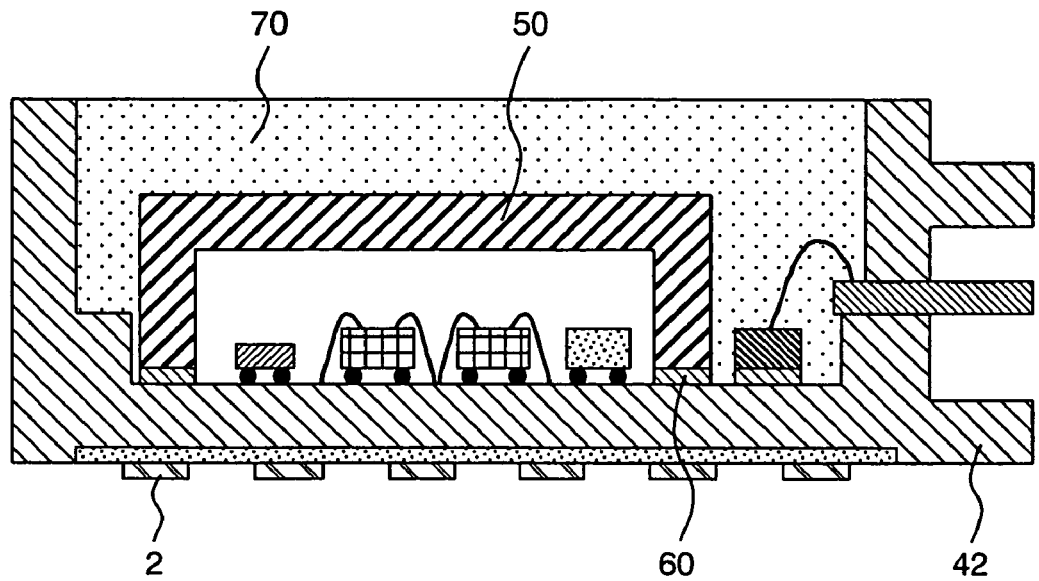
FIG. 5 illustrates another embodiment of the present invention.

FIG. 5 illustrates another embodiment, which differs from the embodiment shown in FIG. 4 in that a separate structure is employed for the antenna pattern 2. That is, a substrate which the antenna pattern 2a is formed separates from the case 42. This configuration increases the flexibility of the design for antenna characteristic.

Figure 6:
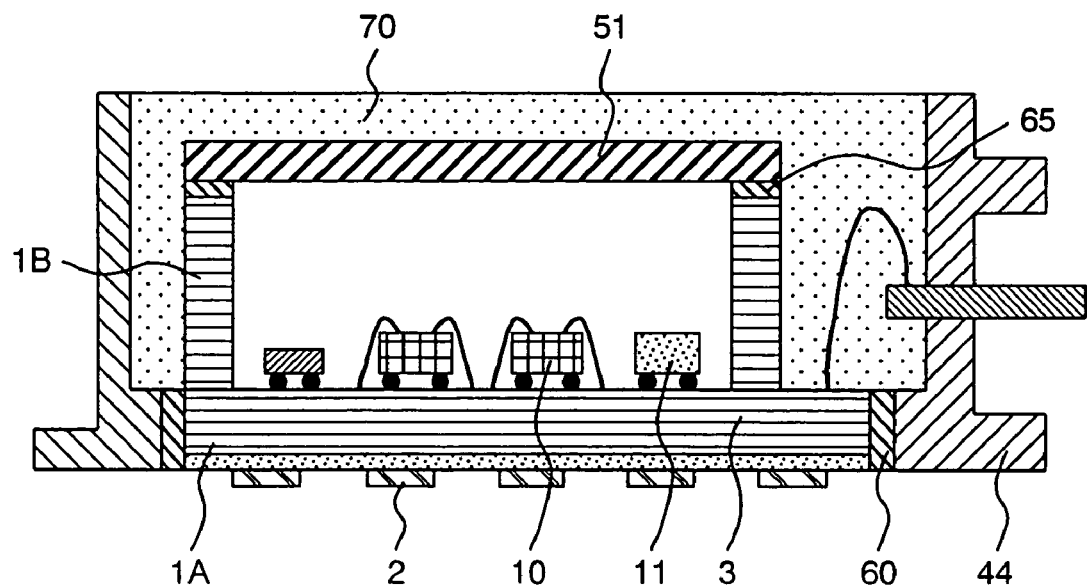
FIG. 6 illustrates another embodiment of the present invention.

FIG. 6 illustrates another embodiment in which an inorganic multilayer substrate 3 is manufactured by using a multilayer substrate 1A and its member 1B. The member 1B is constituted with same material as multilayer substrate 3. The member 1B constitutes a wall for making a hollow structure around the MMICs 10, 11. A metal cover 51 is joined to the member 1B with brazing filler metal 65 such as solder etc. to seal the hollow structure keeping airtight. That is, the member 1B and the metal cover 51 are used instead of the cap 50 shown in FIG. 1 to FIG. 5.

Figure 7:
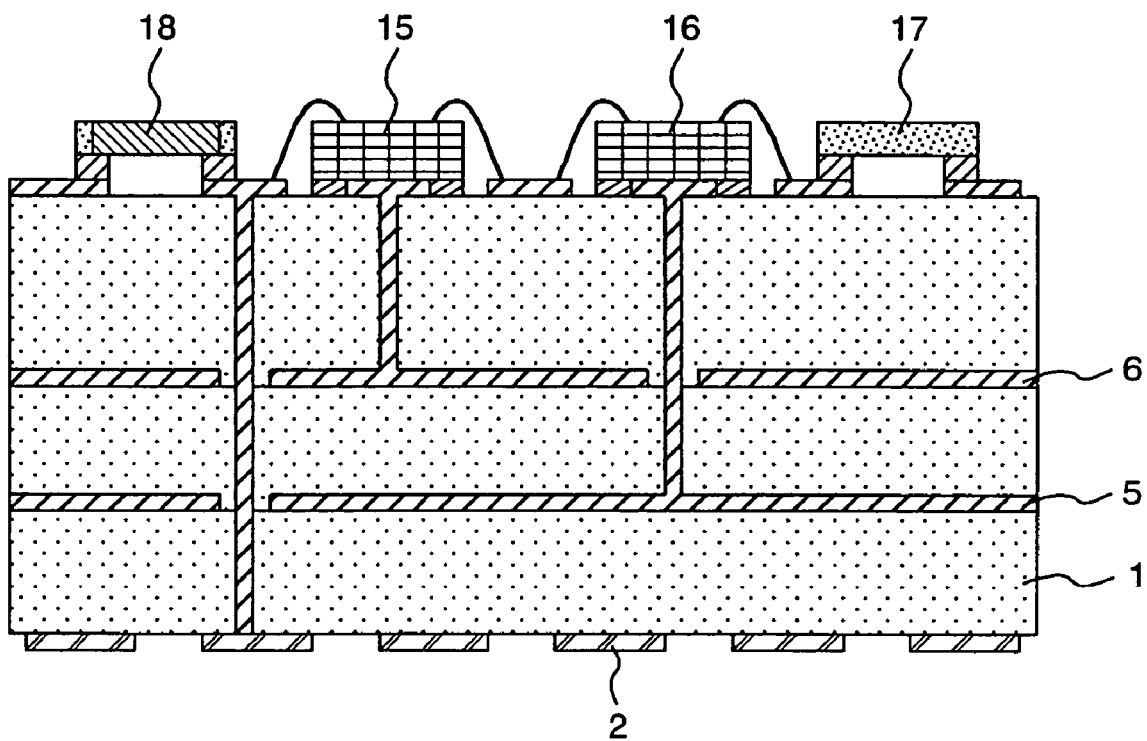
FIG. 7 illustrates one embodiment of a multilayer substrate that is used in a configuration for the present invention.

FIG. 7 illustrates one embodiment of a multilayer substrate 1. An MMIC chip 15, a microcomputer chip 16, a clock oscillator 17, and a filter capacitor 18 are mounted on the multilayer substrate 1. Further, signal separation is provided, for instance, for an analog signal ground 6 and a digital signal ground 5. The opposite surface of the multilayer substrate 1 is provided with an antenna pattern 2.

The above configuration makes it possible to turn the whole millimeter wave radar into a module.

The present invention, which has been described above, provides good electrical characteristic of millimeter waves since it can make a hollow structure around MMICs on a multilayer substrate. Furthermore, since the whole within a case in which houses electric parts is covered a gelled organic resin which has moisture resistance, it is possible to provide a low-cost millimeter wave radar RF module having increased productivity while maintaining the millimeter wave electrical characteristic even though airtightness is not assured.

What is claimed is:

1. A method for manufacturing a millimeter wave radar module that sends out radar waves generated by a MMIC via an antenna pattern, the method comprising the steps of:
    (a) mounting said MMIC on a substrate with wiring;
    (b) enclosing said MMIC by joining a cap having a hollow space to said substrate in such a manner as to position said MMIC in said hollow space; and
    (c) covering a joint between said cap and said substrate with a gelled organic moisture resistant resin; wherein
    said substrate is provided with a wall that forms an enclosure; and
    said gelled organic moisture resistant resin is filled into said enclosure after said joint process.

2. The method according to claim 1, wherein said step of covering a joint is performed in a nitrogen gas atmosphere.

* * * * *